(12) United States Patent
Jao

(10) Patent No.: US 6,492,224 B1
(45) Date of Patent: Dec. 10, 2002

(54) BURIED PIP CAPACITOR FOR MIXED-MODE PROCESS

(75) Inventor: Kuo-Hao Jao, Maio Li (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/905,139

(22) Filed: Jul. 16, 2001

(51) Int. Cl.⁷ .......................................... H01L 21/8242
(52) U.S. Cl. ........................................................ 438/241
(58) Field of Search ................................ 438/241, 238, 438/243, 244, 248, 259

(56) References Cited

U.S. PATENT DOCUMENTS

| | | | |
|---|---|---|---|
| 4,419,812 A | 12/1983 | Topich | 29/571 |
| 5,866,451 A * | 2/1999 | Yoo et al. | 438/241 |
| 5,913,126 A | 6/1999 | Oh et al. | 438/393 |
| 6,103,622 A | 8/2000 | Huang | 438/652 |
| 6,165,861 A | 12/2000 | Liu et al. | 438/382 |
| 6,242,300 B1 * | 6/2001 | Wang | 438/241 |

* cited by examiner

Primary Examiner—David Nelms
Assistant Examiner—Quoc Hoang
(74) Attorney, Agent, or Firm—George O. Saile; Stephen B. Ackerman

(57) ABSTRACT

A new method is provided for the creation of PIP capacitors for mixed-mode processes. The process starts with the creation of Shallow Trench Isolation regions in the surface of a substrate, defining active regions and the region over which the PIP capacitor is to be created on the surface of the substrate. The PIP STI region is etched, lowering the surface of the PIP STI region. A first layer of polysilicon is selectively deposited in the opening created in the layer of STI over which the PIP is to be created, the first layer of polysilicon is polished. The wells for the isolation of the gate electrode and the PIP STI region are implanted in the surface of the substrate. A layer of insulation, serving as the layer of dielectric for the capacitor, is blanket deposited over the surface of the substrate. The deposited layer of insulation is patterned and etched, leaving the layer of insulation in place overlying the first layer of polysilicon. The mixed-mode process is then resumed with conventional processing of creation of a layer of gate oxide, the deposition and patterning of a second layer of polysilicon and the additional Back-End-Of-Line (BEOL) processing that is required to complete the mixed mode structure of a PIP capacitor and a gate electrode.

23 Claims, 5 Drawing Sheets

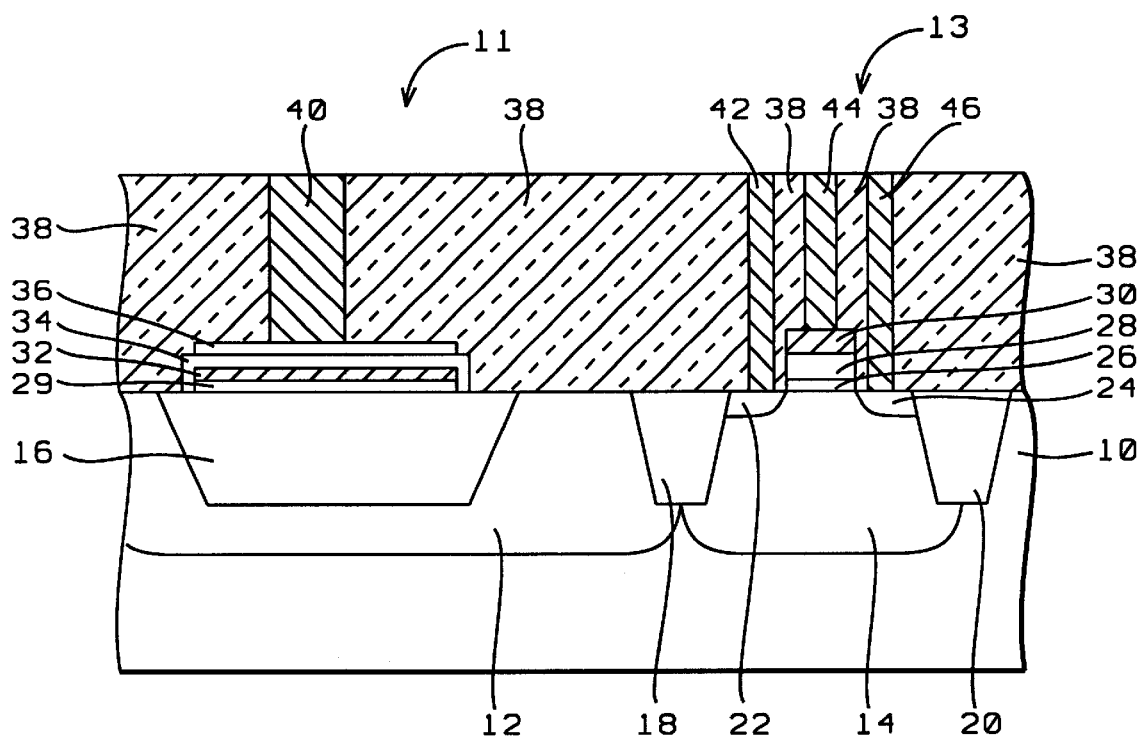
FIG. 1 – Prior Art
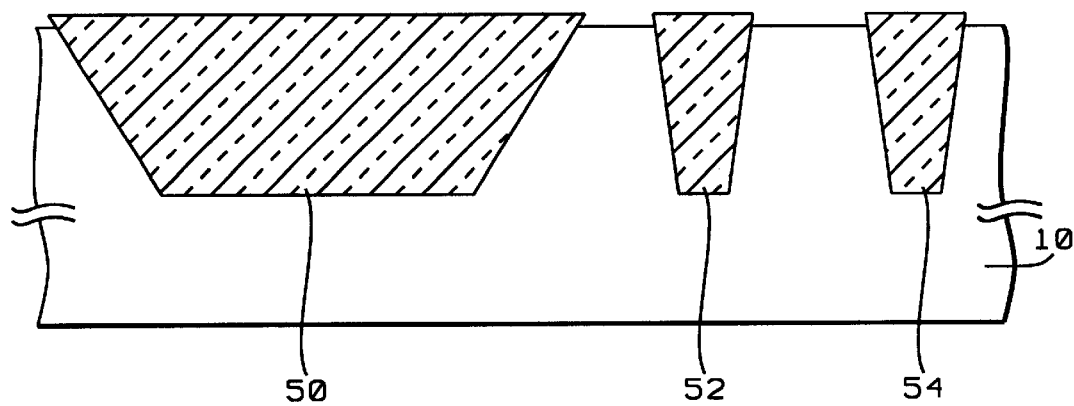
FIG. 2

BURIED PIP CAPACITOR FOR MIXED-MODE PROCESS

BACKGROUND OF THE INVENTION

1. Field of the Invention

The invention relates to the fabrication of integrated circuit devices, and more particularly, to a method of creating a buried Polysilicon Insulator Polysilicon (PIP) capacitor for mixed-mode semiconductor device processing.

2. Description of the Prior Art

With the increased complexity of semiconductor devices has come an increased demand for concurrent creation of active semiconductor devices such as Field Effect Transistors (FET) and capacitors that are in relatively close proximity to the active semiconductor devices. This mixing of active and passive devices is referred to as mixed-mode fabrication of semiconductor components.

The conventional method that is used to simultaneously create a FET and a capacitor is highlighted using FIG. 1. In FIG. 1 is shown a cross section of a semiconductor substrate 10. Defined in the surface of the substrate 10 have been a p-well 12 and a n-well 14. A capacitor 11 is created overlying the p-well 12, a PMOS gate electrode 13 is created overlying the n-well 14. The p-well 12 is electrically insulated from the n-well 14 by the Shallow Trench Isolation (STI) region 18 that has been created in the surface of substrate 10. STI region 16 is the field isolation region over which the dual layer polysilicon capacitor is being created while STI region 20 further defines and insulates the n-well 14. After the regions of insulation (12, 14, 16, 18 and 20) have been defined in the surface of the substrate 10, a thin layer 26 of oxide of created over the surface of the substrate 10. A layer of polysilicon is then deposited, patterned and etched, using conventional methods of photolithography and patterning, simultaneously creating the gate electrode 28 and the first layer 29 of polysilicon of the capacitor 11. The active regions 22 and 24, which form the source and drain regions of the gate electrode 13, are next created by impurity implantation into the surface of the substrate 10 that is self aligned with the structure 26/28 of gate electrode 13. Low resistivity contacts to the active regions in the surface of the substrate and to the gate electrode are next established using convention methods of salicidation. Salicidation is performed by depositing a layer of metal comprising refractory metal, such as tungsten, titanium, tantalum, molybdenum and platinum, over the surface of the structure and by then heat treating the structure in order to cause the deposited metal to interact with the underlying silicon. In this manner are formed silicide surface regions overlying the source and drain regions 22 and 24 (the silicided surfaces are not highlighted in FIG. 1), the contact 30 with the gate electrode and the layer 32 overlying the layer of first polysilicon 29. The layers 26, 28 and 30 form the gate electrode, the layers 29 and 32 form the first electrode of capacitor 11. At this time, the gate electrode is typically completed with the creation of gate spacers on the sidewalls of the column 26, 28 and 30. The common practice of first creating Lightly doped Diffusion (LDD) regions in the surface of the substrate 10, self aligned with the gate electrode and immediately after the gate electrode has been formed, is well known in the art. For these applications, the deep source/drain implant is performed after the gate spacers have been formed on sidewalls of the gate structure and in addition to the LDD implants. For the completion of the formation of the capacitor 13, a patterned layer 34 of capacitor dielectric is created overlying the lower electrode 29/32 of capacitor 11 after which a patterned second layer 36 of polysilicon is created that forms the second electrode of capacitor 11. Capacitor 11 therefore comprises two layers of polysilicon, separated by a layer of insulation (capacitor dielectric), from which the name polysilicon-insulator-polysilicon (PIP) is derived. After this, the components of the structure must be made accessible for external connection, which is done by depositing a layer 38 of dielectric over the structure, creating openings in this layer 38 of dielectric and filling these openings with a conductive material, typically metal. In this manner are created metal plug 40, which connects to the second electrode of capacitor 11, metal plug 42 which connects to the source region of gate electrode 13, metal plug 44 which connects to the gate electrode 13 and metal plug 46 which connects to the drain region of gate electrode 13.

The process can be summarized as follows:

gate oxide growth poly 1 deposition capacitor dielectric film deposition poly 2 deposition poly 2 patterning poly 1 patterning NLDD/PLDD implants spacer formation $N^+/P^+$ implants for source/drain regions, and salicide formation.

The above highlighted mixed-mode process of creating a PIP capacitor while simultaneously creating a gate electrode has a number of disadvantages. The process results in high topography and makes the subsequent back-end-of-line (BEOL) processing more difficult. In addition, an extra thermal cycle is required in order to anneal the PIP insulator film to maintain desired quality levels. These latter requirements have a detrimental effect on a standard logical device. These disadvantages make a mixed-mode process more complex than the standard logic process.

U.S. Pat. No. 6,165,861 (Liu et al.), U.S. Pat. No. 6,103,622 (Huang), U.S. Pat. No. 4,419,812 (Topich), U.S. Pat. No. 5,913,126 (Oh et al.) show related capacitor processes and structures.

SUMMARY OF THE INVENTION

A principle objective of the invention is to enable mixed-mode processes for the creation of a PIP capacitor and a gate electrode such that this process does not influence gate electrode topography.

Another objective of the invention is to provide a method of creating in mixed-mode a PIP capacitor and gate electrodes such that processing steps that are required for the creation of the PIP capacitor have no influence on standard logic devices.

In accordance with the objectives of the invention a new method is provided for the creation of PIP capacitors for mixed-mode processes. The process starts with the creation of Shallow Trench Isolation regions in the surface of a substrate, defining active regions and the region over which the PIP capacitor is to be created over the surface of the substrate. The PIP STI region is etched, lowering the surface of the PIP STI region. A first layer of polysilicon is selectively deposited in the opening created in the layer of STI over which the PIP is to be created, the first layer of polysilicon is polished. The wells for the isolation of the gate electrode and the PIP STI region are implanted into the surface of the substrate. A layer of insulation, serving as the layer of dielectric for the capacitor, is blanket deposited over the surface of the substrate. The deposited layer of insulation is patterned and etched, leaving the layer of insulation in place overlying the first layer of polysilicon. The mixed-mode process is then resumed with conventional processing of creating a layer of gate oxide, the deposition and patterning of a second layer of polysilicon and the additional Back-End-Of-Line (BEOL) processing that is required to complete the mixed-mode structure of a PIP capacitor and a gate electrode.

BRIEF DESCRIPTION OF THE DRAWINGS

FIG. 1 shows a cross section of a prior art mixed-mode creation of a gate electrode and a Polysilicon-Insulator-Polysilicon capacitor.

FIG. 2 shows a cross section of the surface of a silicon substrate, Shallow Trench Isolation regions have been created in the surface of the substrate.

DESCRIPTION OF THE PREFERRED EMBODIMENTS

Figure 3:
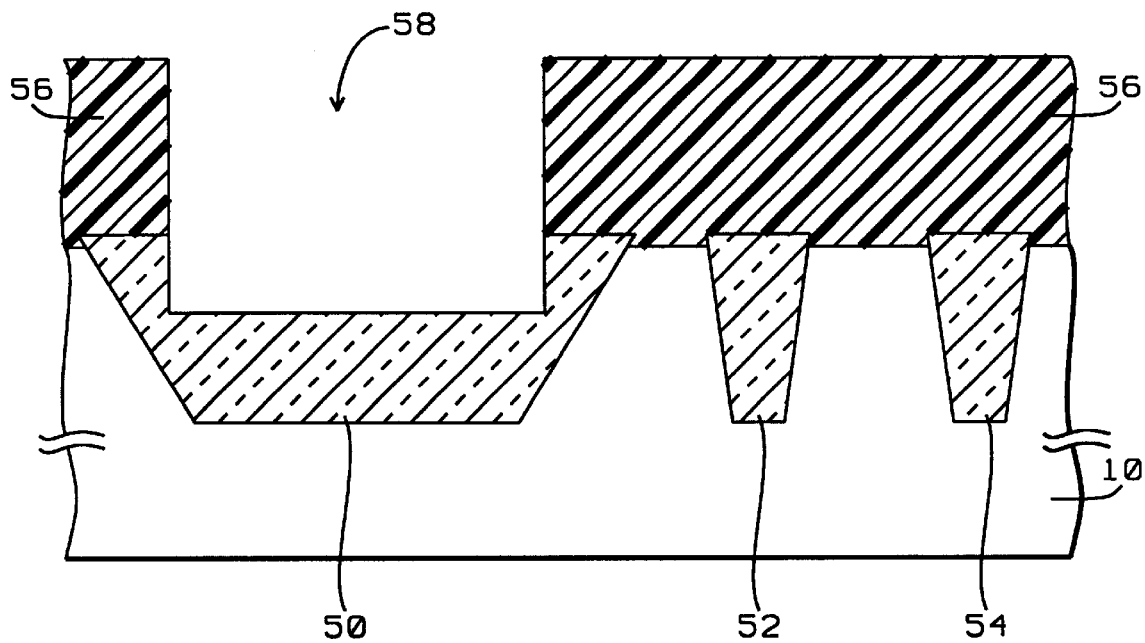
FIG. 3 shows a cross section of the silicon substrate after the STI region over which a PIP capacitor is to be created has been etched.

In order to better highlight the difference of the invention with existing processing for the creation of gate electrodes and PIP capacitors in mixed-mode processing, the conventional method and sequence of this process is first highlighted. This follows the prior art process that has been highlighted with the use of FIG. 1.

The conventional method of creating PIP capacitors and gate electrodes in a mixed-mode process:
- starts with a silicon substrate, regions of Shallow Trench Isolation (STI) are defined in the surface of the substrate
- a layer of gate oxide is created over the surface of the substrate
- a first layer of polysilicon is deposited over the surface of the layer of gate oxide
- the layer of poly gate is patterned and etched, creating a patterned layer of first poly for the PIP capacitor and the body for the gate electrode
- p-well and n-well impurity regions are defined in the surface of the substrate
- source/drain region impurity implants are performed in the surface of the substrate
- the exposed surfaces of the first layer of polysilicon are salicided, creating a first electrode of the PIP capacitor in addition to creating low resistance contact regions to the gate electrode
- a patterned layer of insulation is deposited over the surface of the first layer of polysilicon of the PIP capacitor, creating the dielectric for the PIP capacitor
- a patterned second layer of polysilicon is deposited over the surface of the layer of insulation of the PIP capacitor, creating the second electrode of the PIP capacitor
- Back-End-Of-Line (BEOL) processing is performed, which makes the contact regions of the gate electrode and the second electrode of the PIP capacitor available for further interconnection. The process of the invention will now be explained in detail.

Referring specifically to FIG. 2, there is shown the cross section of a silicon substrate 10, three STI regions 50, 52 and 54 have been created in the surface of substrate 10. A PIP capacitor is to be created STI overlying region 50, isolation region 52 isolates the PIP capacitor from surrounding active devices while STI region 54 bounds the region in the surface of substrate 10 over which active devices such as gate electrodes are to be created.

The process of creating an STI trench in the surface of a silicon substrate is performed mainly by plasma etching. Basically, in plasma etching as used in the manufacturing of silicon integrated devices, a silicon wafer on whose surface have been deposited various layers, is positioned on a first electrode in a chamber that also includes a second electrode spaced opposite the first. As a gaseous medium that consists of one or more gasses is flowed through the chamber, an r-f voltage, which may include components of different frequencies, is applied between the two electrodes to create a discharge that ionizes the gaseous medium and that forms a plasma that etches the wafer. By appropriate choice of the gasses of the gaseous medium and the parameters of the discharge, selective and anisotropic etching is achieved. In most modern processes, a dry etch is performed wherein the wafer is exposed to a plasma, formed in the flow of one or more gasses. Typically, one or more halogenated compounds are used as an etchant gas. For example, $CF_4$, $CHF_3$ (Freon 23) $SF_6$ or $NF_3$ can be used. Added can be gases such as $O_2$, Ar and $N_2$.

The trenches that are required for the STI regions 50, 52 and 54 can also be etched into the surface of the wafer using a wet etchant. One suitable wet etchant for a wafer that is formed of monocrystalline silicon is a solution containing a mixture of KOH (potassium hydroxide) and $H_2O$. This solution anisotropically etches the silicon substrate, forming grooves in the substrate having sidewalls that are sloped at an angle of about 54 degrees C. with the horizontal. The slope of the sidewalls is a function of the etch rates of monocrystalline silicon along the different crystalline orientations. The surface of the substrate represents <100> planes of the silicon, which etches faster than the sloped sidewalls that represent the <111> plane.

STI regions can be made using a number of methods. For instance, one method is the Buried Oxide (BOX) isolation used for shallow trenches. The method involves filling the trenches with a chemical vapor deposition (CVD) silicon oxide ($SiO_2$) which is then etched back or mechanically or chemically polished to yield a planar surface. The shallow trenches etched for the BOX process are anisotropically plasma etched into the silicon substrate.

Another approach in forming STI regions is to deposit silicon nitride on thermally grown oxide (grown over the surface of a silicon substrate). After deposition of the nitride, a shallow trench is etched into the substrate using a mask. A layer of oxide is then deposited into the trench so that the trench forms an area of insulate dielectric which acts to isolate the devices in a chip and thus reduce the cross talk between active devices. The excess deposited oxide must be polished off and the trench planarized to prepare for the next level of metalization. The silicon nitride serves as a stop layer for the CMP polishing.

In the STI approach for the VLSI technology, deep trenches are typically made in the substrate by reactive ion etching (RIE). The trenches are typically about 0.4 $\mu$m deep and spaced between about 0.3 $\mu$m apart from another trench. The ULSI technology requires trenches that are deeper and spaced closer together posing new problems of field turn-on, punchthrough and gap-fill within the trenches and others. Trenches 50, 52 and 54 may be created of different heights since the purpose for the STI region 50 differs from the purpose of trenches 52 and 54. It is therefore to be expected that the trench for STI region 50 may be created to a depth of about 4,000 Angstrom.

FIG. 3 shows a cross section of semiconductor substrate 10 after a layer 56 of photoresist has been deposited over the surface of the substrate, including the surface of the STI regions that have been created in the substrate. Layer 56 of photoresist has been patterned and developed, creating opening 58 in the layer 56 of photoresist that aligns with the STI region 50 and that partially exposes the surface of STI region 50. The oxide contained in STI region has been partially removed by etching, creating an opening in the surface of STI region 50 and significantly lowering the surface of the STI region 50.

The deposition, patterning and developing of the layer of photoresist 56 uses conventional methods of photolithography and photoresist development. The opening for the STI region 50 (created in the surface of substrate 10) has a depth of about 4,000 Angstrom. The opening, shown in cross section in FIG. 3, which is created in the surface of the (oxide layer that fills) STI region 50 can have a height of between about 1,500 and 3,000 Angstrom.

The layer of oxide that has been used to fill the trench for the STI region 50 can be etched using for instance reactive ion etching (RIE) using Ar/$CF_4$ as an etchant at a temperature of between about 120 and 160 degrees C., a pressure of between about 0.30 and 0.40 Torr, for a time of between about 30 and 40 seconds, using a dry etching process.

After the layer of oxide contained in STI region 50 has been etched, the patterned layer 56 (FIG. 3) of photoresist is removed from the surface. For this purpose, sulfuric acid ($H_2SO_4$) and mixtures of $H_2SO_4$ with other oxidizing agents such as hydrogen peroxide ($H_2O_2$) are widely used in stripping photoresist or in cleaning a wafer surface after the photoresist has been stripped by other means. For instance, a frequently used mixture is seven parts $H_2SO_4$ to three parts of 30% $H_2O_2$ or a mixture of 88% sulfuric acid and 12% nitric acid. Wafers to be stripped can be immersed in the mixture at a temperature between about 100 degrees C. and about 150 degrees C. for 5 to 10 minutes and then subjected to a thorough cleaning with deionized water and dried by dry nitrogen. Inorganic resist strippers, such as the sulfuric acid mixtures, are very effective in the residual free removal of highly postbaked resist. They are more effective than organic strippers and the longer the immersion time, the cleaner and more residue free wafer surface can be obtained.

The photoresist layer 56 can also be removed using plasma oxygen ashing and careful wet clean. The oxygen plasma ashing is heating the photoresist in a highly oxidized environment, such as an oxygen plasma, thereby converting the photoresist to an easily removed ash. The oxygen plasma ashing can be followed by a native oxide dip for 90 seconds in a 200:1 diluted solution of hydrofluoric acid.

Figure 4:
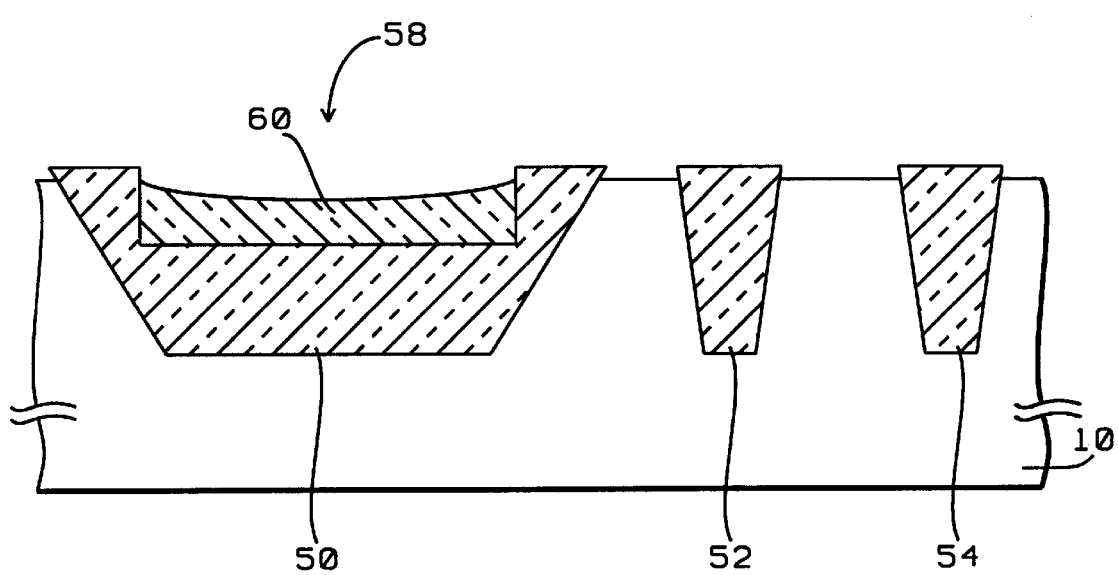
FIG. 4 shows a cross section of the silicon substrate after a first layer of polysilicon has been selectively deposited over the surface of the STI region over which a capacitor is to be created.

FIG. 4 shows a cross section of the semiconductor substrate 10 after the patterned layer 56 of photoresist has been removed from the surface. In addition, a layer 60 of polysilicon has been in-situ deposited inside the opening 58 that has been created in STI region 50. This layer 60 of polysilicon is polished after deposition, creating the slightly concave surface profile for the layer 60 that is shown in cross section in FIG. 4. The surface of layer 60 is concave due to the flexibly nature of the polishing pad that is used for the polishing (Chemical Mechanical Polishing or CMP) of the surface of layer 60. Since the opening 58 has a relatively large diameter, the polishing pad is likely to penetrate the opening 58, polishing the layer 60 below the surface of the layer 50 of STI oxide.

One of the issues that arises during the creation of mixed-mode PIP capacitors is that this process lends itself to causing problems within the created structures that affect back-end-of-line processing. BEOL processing is the processing that takes place after the PIP capacitor and the gate electrodes have been created on the surface of the substrate. This can be highlighted as follows. Following the forming of the trenches in the surface of a silicon substrate, the trenches are filled with a suitable material such as oxide, polysilicon or an organic polymeric material, for example polyimide. The dielectric-filled trench isolation provides effective dielectric isolation between devices, however a fundamental disadvantage of this scheme is that the resulting structure tends to be non-planar. To elaborate on this, attention is focused on a polyimide filled trench isolation. In this process, after etching the trench in the semiconductor substrate, polyimide is applied over the entire substrate followed by a baking step to cure and evaporate the solvents in the polyimide. During this baking step, since the trench bed for the STI region 50 offers a significantly greater volume to be filled with the polyimide material than the remainder STI regions 52 and 54 of the substrate, invariably a trough is formed over the trench region of the STI region 50. In other words, a difference in polyimide planarization occurs in the polyimide material overlying the trench region and the remainder of the substrate. In addition to the lack of complete local planarization, the prior art polyimide-filled trench isolation also suffers from lack of global planarization (i.e., planarization across the entire chip or wafer). To further highlight this, it is not uncommon for a VLSI or ULSI chip to consist of high device density regions corresponding to a memory section having a large number (10,000 or more) of active devices (e.g., transistors) coexisting with low device density regions corresponding to a logic section or a test device area, the latter, in general, being the kerf area of the semiconductor wafer from which the chips are diced. Since each of the devices is surrounded with trench isolation, there will exist on the chip both high trench density and low trench density regions. When such a structure is created with polyimide material, since the high trench density region offers a significantly larger volume to be filled by polyimide compared to the low trench density region, a profoundly non-planar polyimide-coated structure will result.

The non-planar polyimide-filled structures, although they provide an effective dielectric isolation between devices, pose a number of disadvantages to subsequently forming single or multi-level metalization to interconnect the various components of the integrated circuit. One disadvantage is that the uneven topography poses resolution problems in defining images thereon. That is, in a subtractive metalization process in which a blanket layer of metal is applied to the full surface of the substrate, followed by applying a photoresist layer to the resulting non-planar metal surface and exposing to light for patterning the resist, the resolution of the image in the high and low trench density regions will not be the same.

The invention addresses this problem of lack of uniform planarity across the surface of a substrate that is mixed-mode processed for the formation of PIP capacitors and surrounding logic circuitry by "hiding" the poly 1 pattern under the surface (intaglio) of the STI region 50, thus largely eliminating the problem of lack of uniform planarity of the poly 1 layer and ultimately the second electrode of the PIP capacitor.

The layer 60 of polysilicon (FIG. 4) can be grown at a temperature between 600 and 640 degrees C. using LPCVD, to a thickness which is adequate to fill the opening 58 that has been created in the STI region 50.

Figure 5:
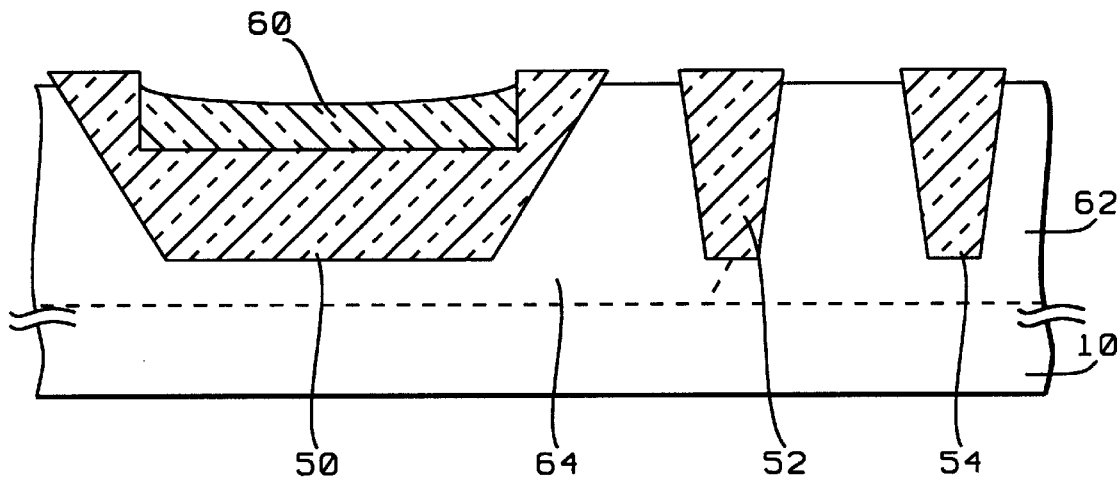
FIG. 5 shows a cross section of the silicon substrate after p-well and n-well creation in the surface of the substrate.

After the structure that is shown in cross section in FIG. 4 has been created, the surface of the silicon substrate is provided with impurity implants. In the example that is shown it is assumed that gate electrode (not shown in FIG. 4) that is to be created between STI regions 52 and 54 is a PMOS devices, meaning that this PMOS device must be electrically isolated by an n-well underlying the device. For this reason, FIG. 5, n-well implant 62 and p-well implant 64 are performed whereby the n-well implant 62 underlies the region between STI regions 52 and 54 and the p-well implant 64 underlies the STI region 50.

As typical n-well and p-well processing conditions can be cited:

P-well implant:
    boron—energy: 100 to 220 keV
        —dose: 1e13 to 1e14 atoms/cm$^2$
    boron—energy: 5 to 40 keV
        —dose: 1e12 to 5e13 atoms/cm$^2$
    indium—energy: 50 to 250 keV
        —dose: 1e12 to 1e14 atoms/cm$^2$ N-well implant:
    P—energy: 300 to 600 keV
        —dose: 1e13 to 5e14 atoms/cm$^2$
    P—energy: 50 to 300 keV
        —dose: 1e12 to 5e13 atoms/cm$^2$
    As—energy: 50 to 200 keV
        —dose: 1e12 to 1e14 atoms/cm$^2$ The substrate is now further processed for the creation of the PIP capacitor by blanket depositing a layer 66 of insulation over the surface of the substrate. This layer 66 forms a layer of interpoly insulation and most preferably comprises silicon nitride and further decomposed tetraethyl orthosilicate deposited at low pressure (LPTEOS). The layer of LPTEOS is first created, to a thickness of between about 100 and 1,000 Angstrom, after which the layer of silicon nitride is deposited over the layer of LPTEOS. The layer of silicon nitride ($Si_3Ni_4$) can be deposited using LPCVD or PECVD procedures at a pressure between about 200 mTorr and 400 mTorr, at a temperature between about 600 and 800 degrees C., to a thickness of about 150 to 300 Angstrom using $NH_3$ and $SiH_4$ or $SiCl_2H_2$. The silicon nitride layer can also be deposited using LPCVD or PECVD procedures using a reactant gas mixture such as dichlorosilane ($SiCl_2H_2$) as a silicon source material and ammonia ($NH_3$) as a nitrogen source, at a temperature between about 600 and 800 degrees C., at a pressure between about 300 mTorr and 400 mTorr, to a thickness between about 200 and 300 Angstrom.

Figure 6:
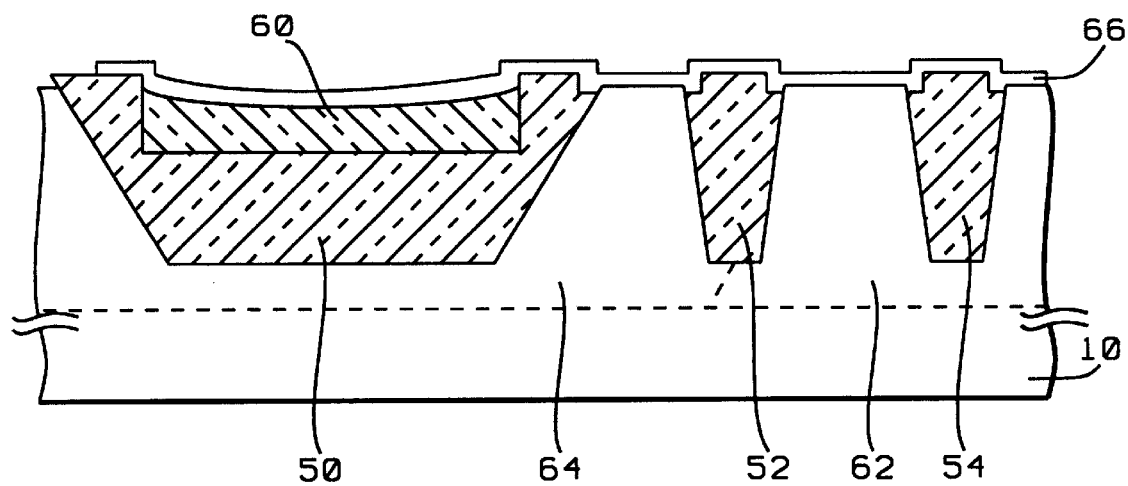
FIG. 6 shows a cross section of the silicon substrate after a layer of insulation has been deposited over the surface of the silicon substrate.

After the layer of LPTEOS (PIP capacitor dielectric) has been deposited, it is of advantage to apply a processing step of oxide anneal to this layer, this to improve the dielectric constant of the PIP dielectric of LPTEOS. Prior art processing follows the sequence (previously highlighted) of creating gate oxide, creating a patterned layer of first poly for the PIP capacitor and for the body for the gate electrode, performing p-well and n-well impurity implants, performing source/drain region impurity implants, salicidation, creating a first electrode of the PIP capacitor, depositing a patterned layer of insulation over the surface of the first layer of polysilicon of the PIP capacitor, and creating the dielectric for the PIP capacitor. From this sequence it is clear that a step of anneal of the dielectric of the PIP capacitor is performed after the body of the gate electrode has been created. The anneal that is performed using the prior art processing sequence has a detrimental effect on the polysilicon that forms the body of the gate electrode by slightly moving (shifting) this polysilicon. This has a negative effect on the construction of the gate electrode using the prior art processing cycle. It is clear from the cross section that is shown in FIG. 6 that an anneal of the oxide of layer 66 (the dielectric for the PIP capacitor) has no effect on the body of the gate electrode for the simple reason that this body of the gate electrode has not yet been created. This is an advantage of the processing sequence of the invention.

Another approach of performing the anneal of the capacitor dielectric is to perform this anneal after a layer of gate oxide (layer 70, FIG. 8) has been created over the surface region of the active region of the substrate. In this case, both the anneal of the capacitor dielectric and the anneal of the gate oxide layer is performed at the same time, saving a processing step of anneal of the PIP dielectric layer since this anneal becomes part of the gate oxide anneal. This is another advantage of the invention, this anneal is in this case performed prior to the deposition of the second layer of polysilicon.

The anneal that is performed to the layer 66 of LPTEOS is a rapid thermal annealing in a temperature range of between about 600 and 800 degrees C. for a time between about 20 and 40 seconds in an oxygen environment.

Figure 7:
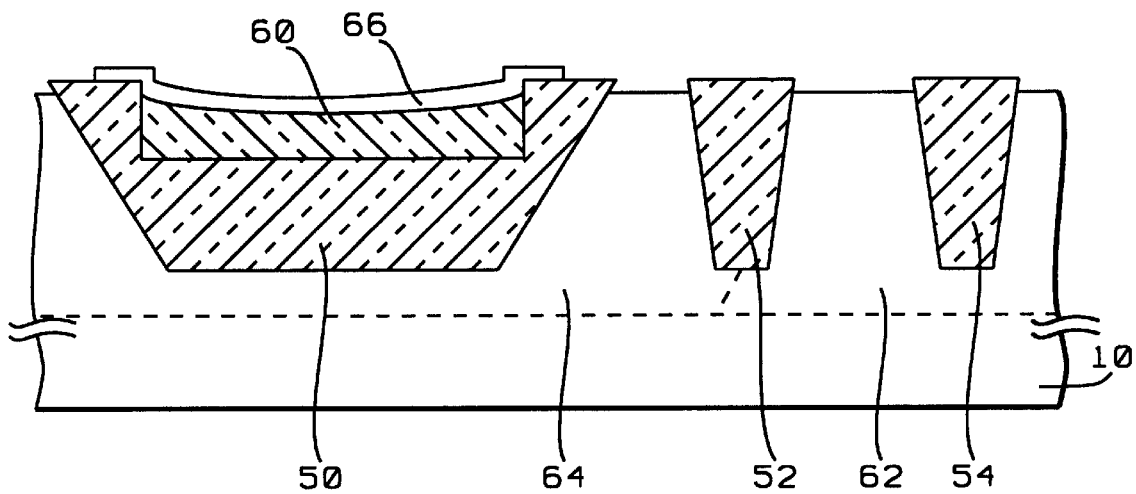
FIG. 7 shows a cross section of the silicon substrate after the deposited layer of insulation has been etched.

The layer 66 of insulation must be removed from above the surface of the substrate except where this layer serves as the dielectric layer of the PIP capacitor, that is layer 66 is removed from above the surface of substrate 10 except where this layer 66 overlies the STI region 50. This is shown in cross section in FIG. 7. The deposited layer of silicon nitride is etched first after which the layer of LPTEOS is etched.

The silicon nitride layer can be wet etched using a phosphoric acid solution. The silicon nitride can also be etched using anisotropic RIE using $CHF_3$ or $SF_6$-$O_2$ as an etchant. The silicon nitride layer can also be dipped into phosphoric acid ($H_3PO_4$) to be removed.

The preferred etching conditions for the LPTEOS etch are as follows: etchant gas: $CF_4$ or $CHF_3$ at a flow rate of about 15 sccm, gas pressure about 800 mTorr, rf power density about 400 Watts, no magnetic field applied, wafer temperature about −17 degrees C. (which is the chuck temperature), time of the etch about 10 seconds.

Figure 8:
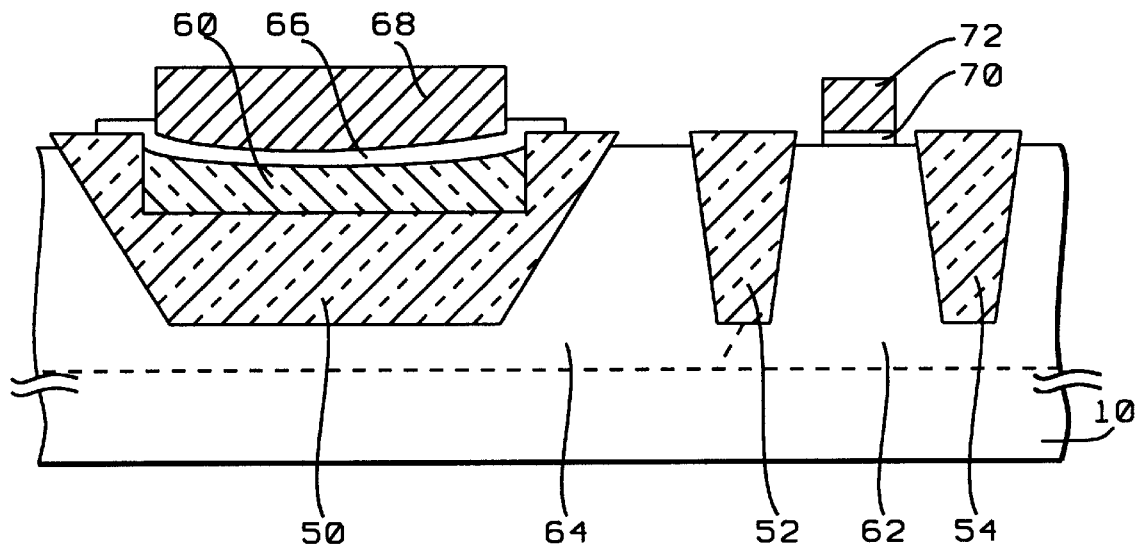
FIG. 8 shows a cross section of the silicon substrate after a layer of gate oxide has been created, a second layer of polysilicon has been deposited over the surface of the silicon substrate, the second layer of polysilicon has been patterned and etched, creating the second electrode for the PIP capacitor and creating the body of a gate electrode.

FIG. 8 shows a cross section after a layer 70 of gate oxide has been created over n-well 62, a second layer of polysilicon has been deposited over the surface of the substrate and has been patterned and etched to form the second gate electrode 68 of the PIP capacitor and the layer 72 of polysilicon that forms the body of the gate electrode.

From the cross section that is shown in FIG. 8 it is clear that the patterned layer 68 (for the second electrode of the PIP capacitor) and patterned layer 72 (for the body of the gate electrode) are created during one and the same processing cycle. From this follows that the surfaces of these two layers 68 and 72 are of the same height (the surface of layer 68 is removed from the plane of the surface of substrate 10 by a distance which is equal to the distant between the surface of layer 72 and the plane of the surface of substrate 10), meaning that concern of lack of planarity between these two surface has been removed. The surfaces of layer 68 and 72 are polished as pa of the polishing of the deposited second layer of polysilicon and before these layers are patterned and etched.

This improvement of the topography of the mixed mode PIP capacitor and CMOS device is even further evident when comparing the prior art processing sequence as shown in cross section in FIG. 1 with the cross section that is shown in FIG. 8. The cross section that is shown in FIG. 8 shows the highlighted advantage of having the surface of the second poly (from which layer 68 and 72 are created) being at the same height. In comparing this (FIG. 8) with the cross section of prior art processing that is shown in FIG. 1, it is clear in FIG. 1 that there is no such connection between the control of the topography of the PIP capacitor and the gate electrode. This is a significant advantage of the invention since it provides a significant improvement in the topography of a mixed mode PIP capacitor and CMOS device.

Further processing, although not part of the invention, comprises the creation of LDD and source/drain regions in the surface of the substrate self-aligned with the gate electrode, processes of salicidation of the contact regions of the gate electrode and the PIP capacitor, the deposition of a layer of dielectric (Intra Level Dielectric or ILD) and the creation of conductive plugs that are required to contact the PIP capacitor and the gate electrode with its source/drain regions. Since these processes are well known in the art and since these processes further are not part of the invention, these processes will not be further described at this time.

Figure 9:
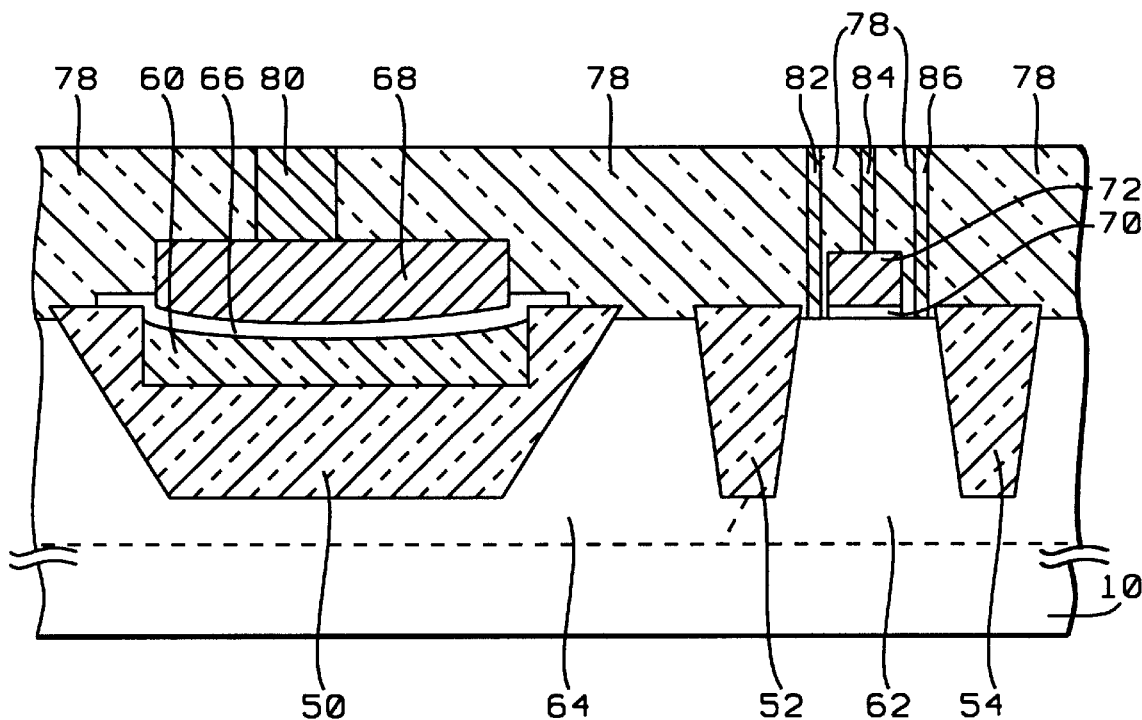
FIG. 9 shows a cross section where Back-End-Of-Line processing has been completed.

FIG. 9 shows a cross section where Back-End-Of-Line processing has been completed. This cross section does not attempt to show all the details that are typically required for this processing, for instance the cross section of FIG. 9 does not show gate spacers on the sidewalls of the gate electrode, it does not show a distinction between Lightly Doped Diffusion (LDD) and source/drain region implants, it does not show salicided layers that can be created over contact regions of the CMOS device and the PIP capacitor and the like.

What is shown in the cross section of FIG. 9 is what is typically referred to as Back-End-Of-Line processing, that is:

74 and 76, the source and drain regions of the CMOS device 70/72

78, a layer of Inter Layer Dielectric (ILD) that has been deposited over the surface of the substrate 80, a conductive plug created through layer 78 in order to establish electrical contact with the second electrode 68 of the PIP capacitor 82, a conductive plug created through layer 78 in order to establish electrical contact with the source region 74 of the CMOS device 84, a conductive plug created through layer 78 in order to establish electrical contact with the gate electrode 70/72 of the CMOS device 86, a conductive plug created through layer 78 in order to establish electrical contact with the drain region 76 of the CMOS device.

Layer 78 of dielectric can be a relatively thick layer of dielectric or insulation and is typically deposited to a thickness of between about 20,000 and 24,000 Angstrom, using methods of LPCVD and forming a layer of Inter Metal Dielectric (IMD). Inter Metal Dielectric layer 78 can contain any suitable dielectric such as silicon dioxide ("oxide", doped or undoped) or silicon nitride ("nitride"), silicon oxynitride, fluoropolymer, parylene, polyimide, tetra-ethyl-ortho-silicate (TEOS) based oxides, boro-phosphate-silicate-glass (BPSG), phospho-silicate-glass (PSG), boro-silicate-glass (BSG), oxide-nitride-oxide (ONO), a low dielectric constant material, such as hydrogen silsesquioxane and HDP-FSG (high-density-plasma fluorine-doped silicate glass.

Conventional methods of photolithography combined with anisotropic etching are used to create openings for conductive plugs 80, 82, 84 and 86 through the layer 78 of IMD. After these openings have been created though the layer 78 of IMD, a conducting metal, such as an aluminum/copper alloy, is deposited over the surface of layer 78, filling the openings with this conducting metal and establishing contact plugs 80, 82, 84 and 86.

To review the processing of the invention:

starts with a silicon substrate, regions of Shallow Trench Isolation (STI) are defined in the surface of the substrate; these regions can be differentiated between regions over the surface of which a PIP capacitor is to be created and regions that electrically isolate active surface regions of the substrate over which logic devices such as gate electrodes are to be created etch the oxide that is used to fill the STI region over which a PIP capacitor is to be created, creating an opening in this layer of oxide selectively deposit a first layer of polysilicon in the opening that is created in the layer of oxide over which a PIP capacitor is to be created, creating a first electrode of a PIP capacitor define p-well and n-well impurity regions in the surface of the substrate blanket deposit a layer of insulation over the surface of the substrate, this layer of insulation is used for the dielectric of the PIP capacitor etch the layer of insulation, leaving the layer of insulation in place overlying the STI region over which a PIP capacitor is to be created, creating a layer of dielectric for the PIP capacitor create a layer of gate oxide overlying the active surface of the substrate deposit a second layer of polysilicon, polish the second layer of polysilicon, pattern and etch the second layer of polysilicon, forming the body of a gate electrode in addition to forming the second electrode of the PIP capacitor performing Back-End-Of-Line processing of the create structure.

After these processing steps have been completed, the mixed mode process continues modified prior art processing steps. These processing steps are repeated blow, those processing steps that have at this time been performed as the processing sequence of the invention have been placed between brackets and therefore does not need to be performed as part of the modified prior art processing sequence. As follows:

create a layer of gate oxide over the surface of the substrate (already performed in the process of the invention) [deposit a first layer of polysilicon over the surface of the layer of gate oxide]

(already performed in the process of the invention) [pattern and etch the layer of gate oxide, creating a patterned layer of first poly for the PIP capacitor and the body for the gate electrode]

perform source/drain region impurity implants in the surface of the substrate salicide the exposed surfaces of the first layer of polysilicon, creating a first electrode of the PIP capacitor in addition to creating low resistance contact regions to the gate electrode (already performed in the process of the invention) [deposit a patterned layer of insulation over the surface of the first layer of polysilicon of the PIP capacitor, creating the dielectric for the PIP capacitor]

deposit a patterned second layer of polysilicon over the surface of the layer of insulation of the PIP capacitor, creating the second electrode of the PIP capacitor performing Back-End-Of-Line (BEOL) processing that makes the contact regions of the gate electrode and the second electrode of the PIP capacitor available for further interconnection.

The invention therefore:

provides a method to make the topography of the logic devices the same as the topography of generic logic devices, that is logic devices that are created not using mixed-mode processing eliminates the need for a separate PIP oxide anneal that typically is performed for the second layer of polysilicon (that forms the second electrode of the PIP capacitor) because; this anneal can be performed simultaneously with a gate oxide anneal; that is layers 68 and 70, FIG. 8, can be annealed using one and the same anneal cycle.

The processing steps of the invention can be summarized as follows:

perform a generic STI process create an opening in the oxide of the capacitance STI region using conventional photolithography and etch processing deposit a first layer of poly in the opening created in the oxide of the PIP STI region, polish this first layer of polysilicon perform a generic well implant and device Vt implant depositing layer of insulation (dielectric) for the PIP capacitor, suing LPTEOS and SiN as a dielectric material etching the deposited layer of insulation, using conventional photolithography and etch processing, creating the dielectric for the PIP capacitor continue completing the mixed mode process using conventional processing.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for mixed-mode creation of a Polysilicon-Insulator-Polysilicon (PIP) capacitor and CMOS devices on the surface of a semiconductor substrate, comprising the steps of:

providing a semiconductor substrate, said substrate having been provided in the surface thereof with at least one first Shallow Trench Isolation (STI) region over the surface of which a Polysilicon-Insulation-Polysilicon (PIP) capacitor is to be created, said substrate further having been provided in the surface thereof with at least one active region over the surface of which at least one CMOS device is to be created, said at least one active region being bounded by STI regions;

creating a first layer of polysilicon within said first STI region, the surface of said first layer of polysilicon being in a plane about equal to the plane of the surface of said substrate;

creating n-type and p-type impurity implants into the surface of said substrate;

creating a layer of insulation overlying said first layer of polysilicon, said layer of insulation extending over the surface of said first STI region by a measurable amount; and finishing mixed-mode creation of said PIP capacitor and said at least one CMOS device.

2. The method of claim 1 wherein said creating a first layer of polysilicon within said first STI region comprises the steps of:

etching the surface of said first STI region, creating an opening in said at least one first STI region, said opening having a height;

depositing a first layer of polysilicon over the surface of said substrate, including the surface of the opening created in said at least one first STI region and said at least one active region in the surface of said substrate, filling said opening created in said at least one first STI region with a first layer of polysilicon; and polishing the surface of said first layer of polysilicon, removing said first layer of polysilicon from above the surface of said silicon substrate, leaving in place a layer of first polysilicon deposited in said opening created in said at least one first STI region.

3. The method of claim 1 wherein said creating n-type and p-type impurity implants into the surface of said substrate comprises the steps of implanting an n-type impurity into said at least one active surface region of said substrate, whereby Positive Metal Oxide Semiconductor (PMOS) devices are to be created over the surface of said at least one active surface region of said substrate, followed by implanting p-type impurities into the surface region of the substrate surrounding said at least one first STI region.

4. The method of claim 1 wherein said creating n-type and p-type impurity implants into the surface of said substrate comprises the steps of implanting an p-type impurity into said at least one active surface region of said substrate, whereby Negative Metal Oxide Semiconductor (NMOS) devices are to be created over the surface of said at least one active surface region of said substrate, followed by implanting n-type impurities in the surface region of the substrate surrounding said at least one first STI region.

5. The method of claim 1 wherein said creating a layer of insulation overlying said first layer of polysilicon comprises the steps of:

depositing a layer of capacitance dielectric over the surface of said substrate, including the surface of said at least one first STI region, further including the surface of said at least one active region in the surface of said substrate;

depositing a layer of etch stop material over the surface of said layer of capacitance dielectric; and removing said layer of etch stop material and said layer of capacitance dielectric from above the surface of said substrate except where said layers of etch stop material and capacitance dielectric overlay said first layer of polysilicon deposited in said opening created in said at least one first STI region, said layers of etch stop material and capacitance dielectric extending from said surface of said first layer of polysilicon by a measurable amount, said layers of etch stop material and capacitance dielectric not extending further than the surface of said at least one STI region.

6. The method of claim 5 wherein said etch stop material comprises silicon nitride ($Si_3Ni_4$) deposited to a thickness of about 1,500 to 3,000 Angstrom.

7. The method of claim 5 wherein said depositing a layer of capacitance dielectric comprises depositing a layer of Low Pressure Tetraethyl Orthosilicate (LPTEOS), deposited to a thickness between about 100 and 1,000 Angstrom.

8. The method of claim 5 with an additional step of performing an anneal of said deposited layer of capacitance dielectric, said anneal to be performed after said depositing a layer of capacitance dielectric over the surface of said substrate and prior to said depositing a layer of etch stop material over the surface of said layer of capacitance dielectric.

9. The method of claim 8 wherein said anneal that is performed to said layer of capacitance dielectric is a rapid thermal annealing in a temperature range of between about 600 and 800 degrees C. for a time between about 20 and 40 seconds in an oxygen environment.

10. The method of claim 1 wherein said finishing mixed-mode creation of said PIP capacitor and said at least one CMOS device comprises the steps of:

creating a layer of gate oxide over said at least one active region in the surface of said substrate;

depositing a second layer of polysilicon over the surface of said substrate, including the surface of layer of insulation overlying said first layer of polysilicon and said layer of gate oxide;

patterning and etching said second layer of polysilicon and said layer of gate oxide, leaving in place a second layer of polysilicon that aligns with said first layer of polysilicon separated therefrom by said layer of insulation overlying said first layer of polysilicon, further leaving in place a layer of gate oxide and a thereover deposited second layer of polysilicon that is about centered within said at least one active surface region of said substrate; and performing Back-End-Of-Line processing that is required to further complete said CMOS device and to create conductive interconnects to said CMOS device and to said PIP capacitor.

11. The method of claim 10 with an additional step of polishing the surface of said second layer of polysilicon, said additional step to be performed after said step of depositing a second layer of polysilicon over the surface of said substrate and prior to said patterning and etching said second layer of polysilicon and said layer of gate oxide.

12. The method of claim 11 with an additional step of performing an anneal of said deposited layer of capacitance dielectric, said anneal to be performed after said creating a layer pad oxide over the active surface region of said substrate and prior to depositing said second layer of polysilicon over the surface of said substrate.

13. The method of claim 12 wherein said anneal that is performed to said layer of capacitance dielectric is a rapid thermal annealing in a temperature range of between about 600 and 800 degrees C. for a time between about 20 and 40 seconds in an oxygen environment.

14. A method for mixed-mode creation of a Polysilicon-Insulator-Polysilicon (PIP) capacitor and CMOS devices on the surface of a semiconductor substrate, comprising the steps of:

providing a semiconductor substrate having Shallow Trench Isolation (STI) regions formed in the surface thereof, said STI regions comprising a PIP STI region over the surface of which a PIP capacitor is to be created, said STI regions further comprising Complementary Metal Oxide Semiconductor (CMOS) device STI regions defining active regions in the surface of said substrate over which CMOS devices are to be created;

etching the surface of said PIP STI region, creating an opening in said PIP STI region, said opening having a height;

depositing a first layer of polysilicon over the surface of said substrate, including the surface of the opening created in said PIP and the surface of said CMOS STI regions, about filling said opening created in said PIP STI region with a first layer of polysilicon;

polishing the surface of said first layer of polysilicon, removing said first layer of polysilicon from above the surface of said silicon substrate, leaving in place a layer of first polysilicon deposited in said opening created in said PIP STI region;

implanting n-type and p-type impurities into the surface of said substrate, creating n-well and p-well regions of conductivity in the surface of said substrate;

depositing a layer of capacitance dielectric over the surface of said substrate, including the surface of said PIP STI region, further including the surface of said CMOS STI regions;

depositing a layer of etch stop material over the surface of said layer of capacitance dielectric;

removing said layer of etch stop material and said layer of capacitance dielectric from above the surface of said substrate except where said layers of etch stop material and capacitance dielectric overlay said first layer of polysilicon deposited in said opening created in said PIP STI region and extending from said surface of said first layer of polysilicon by a measurable amount while not extending further than the surface of said PIP STI region;

creating a layer of gate oxide over said active region in the surface of said substrate;

depositing a second layer of polysilicon over the surface of said substrate, including the surface of said patterned and etched layer of insulation and said layer of gate oxide;

patterning and etching said second layer of polysilicon and said layer of gate oxide, leaving in place a second layer of polysilicon that aligns with said first layer of polysilicon separated therefrom by said patterned and etched layer of insulation, further leaving in place a layer of gate oxide and a thereover deposited second layer of polysilicon that is about centered within said active surface region of said substrate; and performing Back-End-Of-Line processing that is required to further complete said CMOS device and to create conductive interconnects to said CMOS device and to said PIP capacitor.

15. The method of claim 14 wherein said implanting n-type and p-type impurities into the surface of said substrate comprises implanting a n-type impurity in an active surface region of said substrate over the surface of which Positive Metal Oxide Semiconductor (PMOS) devices are to be created followed by implanting p-type impurities in the surface region of the substrate surrounding said PIP STI region.

16. The method of claim 14 wherein said implanting n-type and p-type impurities into the surface of said substrate comprises implanting a p-type impurity in an active surface region of said substrate over the surface of which Negative Metal Oxide Semiconductor (NMOS) devices are to be created followed by implanting n-type impurities in the surface region of the substrate surrounding said PIP STI region.

17. The method of claim 14 wherein said etch stop material comprises silicon nitride ($Si_3Ni_4$) deposited to a thickness of about 1,500 to 3,000 Angstrom.

18. The method of claim 14 wherein said depositing a layer of capacitance dielectric comprises depositing a layer of Low Pressure Tetraethyl Orthosilicate (LPTEOS), deposited to a thickness between about 100 and 1,000 Angstrom.

19. The method of claim 14 with an additional step of performing an anneal of said deposited layer of capacitance dielectric, said anneal to be performed after said depositing a layer of capacitance dielectric over the surface of said substrate and prior to said depositing a layer of etch stop material over the surface of said layer of capacitance dielectric.

20. The method of claim 19 wherein said anneal that is performed to said layer of capacitance dielectric is a rapid thermal annealing in a temperature range of between about 600 and 800 degrees C. for a time between about 20 and 40 seconds in an oxygen environment.

21. The method of claim 14 with an additional step of polishing the surface of said second layer of polysilicon, said additional step to be performed after said step of depositing a second layer of polysilicon over the surface of said substrate and prior to said patterning and etching said second layer of polysilicon and said layer of gate oxide.

22. The method of claim 14 with an additional step of performing an anneal of said deposited layer of capacitance dielectric, said anneal to be performed after said creating a layer pad oxide over the active surface region of said substrate and prior to depositing said second layer of polysilicon over the surface of said substrate.

23. The method of claim 22 wherein said anneal that is performed to said layer of capacitance dielectric is a rapid thermal annealing in a temperature range of between about 600 and 800 degrees C. for a time between about 20 and 40 seconds in an oxygen environment.

* * * * *